United States Patent
Debeurre et al.

(10) Patent No.: US 9,527,731 B2
(45) Date of Patent: Dec. 27, 2016

(54) METHODOLOGY AND SYSTEM FOR WAFER-LEVEL TESTING OF MEMS PRESSURE SENSORS

(71) Applicant: FREESCALE SEMICONDUCTOR, INC., Austin, TX (US)

(72) Inventors: Bruno J. Debeurre, Phoenix, AZ (US); Peter T. Jones, Scottsdale, AZ (US); William D. McWhorter, Goodyear, AZ (US); Raimondo P. Sessego, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 59 days.

(21) Appl. No.: 14/514,438

(22) Filed: Oct. 15, 2014

(65) Prior Publication Data
US 2016/0107887 A1 Apr. 21, 2016

(51) Int. Cl.
*G01R 31/20* (2006.01)
*B81C 99/00* (2010.01)
*G01L 27/00* (2006.01)

(52) U.S. Cl.
CPC .......... *B81C 99/004* (2013.01); *B81C 99/005* (2013.01); *B81C 99/007* (2013.01); *G01L 27/005* (2013.01)

(58) Field of Classification Search
CPC ...... G01L 27/00; G01L 27/005; G01L 27/007; B81C 99/0035; B81C 99/005; B81C 99/004
USPC .................................................. 324/754.15
See application file for complete search history.

(56) References Cited

U.S. PATENT DOCUMENTS

| 5,197,089 A | * | 3/1993 | Baker | B82Y 10/00 |
| | | | | 250/491.1 |
| 5,332,469 A | * | 7/1994 | Mastrangelo | B23P 15/00 |
| | | | | 216/13 |
| 5,357,808 A | * | 10/1994 | Fung | G01L 9/0042 |
| | | | | 338/4 |

(Continued)

FOREIGN PATENT DOCUMENTS

| DE | WO 2010054676 A1 | * 5/2010 | ............ G01L 11/006 |
| EP | 1 619 716 A1 | 1/2006 | |

(Continued)

OTHER PUBLICATIONS

BYU Mechanical Engineering, Introduction to Microelectromechanical Systems, www.compliantmechanism.byu.edu/. Apr. 2011.*

(Continued)

*Primary Examiner* — Jermelle M Hollington
*Assistant Examiner* — Sean Curtis
(74) *Attorney, Agent, or Firm* — Charlene R. Jacobsen

(57) ABSTRACT

A method for testing a plurality of pressure sensors on a device wafer includes placing a diaphragm of one of the pressure sensors on the device wafer in proximity to a nozzle of a test system. A pneumatic pressure stimulus is applied to the diaphragm via an outlet of the nozzle and a cavity pressure is measured within a cavity associated with the pressure sensor in response to application of the pneumatic pressure stimulus. The pneumatic pressure stimulus within the cavity corresponds to the pressure applied to the diaphragm. Methodology is executed to test the strength and/or stiffness of the diaphragm. Additionally, the methodology and test system can be utilized to determine an individual calibration factor for each pressure sensor on the device wafer.

16 Claims, 10 Drawing Sheets

(56) References Cited

U.S. PATENT DOCUMENTS

| | | | |
|---|---|---|---|
| 6,279,402 B1* | 8/2001 | Fisher | C23C 16/45557 73/754 |
| 6,341,259 B1* | 1/2002 | Gutierrez | G01P 21/00 367/140 |
| 6,373,271 B1 | 4/2002 | Miller et al. | |
| 6,378,378 B1* | 4/2002 | Fisher | B64D 15/20 340/582 |
| 6,590,212 B1* | 7/2003 | Joseph | B81C 99/005 250/306 |
| 6,686,993 B1* | 2/2004 | Karpman | B81C 99/005 356/237.1 |
| 6,708,132 B1* | 3/2004 | Gutierrez | B81C 99/005 324/243 |
| 6,923,069 B1* | 8/2005 | Stewart | G01L 9/0042 73/723 |
| 7,068,056 B1* | 6/2006 | Gibbs | G01R 31/2891 324/750.16 |
| 7,595,653 B2 | 9/2009 | Henttonen et al. | |
| 8,464,594 B2* | 6/2013 | Narendrnath | G01F 1/20 73/861 |
| 9,034,666 B2* | 5/2015 | Vaganov | G01L 5/162 324/750.01 |
| 9,116,189 B2* | 8/2015 | Zelder | G01R 27/28 |
| 2005/0116729 A1* | 6/2005 | Koester | G01L 27/005 324/750.03 |
| 2006/0081062 A1* | 4/2006 | Silverbrook | B60C 23/0408 73/754 |
| 2006/0243023 A1* | 11/2006 | Wong | B81C 99/004 73/1.15 |
| 2007/0068263 A1* | 3/2007 | Reinwald | G01L 27/005 73/714 |
| 2007/0080695 A1* | 4/2007 | Morrell | B81C 99/004 324/658 |
| 2008/0036482 A1* | 2/2008 | Tomita | G01R 31/2887 324/750.18 |
| 2009/0039908 A1* | 2/2009 | Ikeuchi | B81C 99/005 324/754.07 |
| 2009/0095095 A1* | 4/2009 | Hayashi | B81C 99/005 73/865.8 |
| 2009/0128171 A1* | 5/2009 | Okumura | B81C 99/005 324/754.07 |
| 2011/0031657 A1 | 2/2011 | Minbiole et al. | |
| 2011/0316571 A1* | 12/2011 | Kiyokawa | G01R 31/2891 324/750.16 |
| 2012/0194207 A1* | 8/2012 | Vaganov | G01L 5/162 324/750.01 |
| 2013/0001550 A1* | 1/2013 | Seeger | G01L 5/223 257/48 |
| 2013/0247688 A1* | 9/2013 | Binkhoff | B81C 99/003 73/862.621 |
| 2013/0305804 A1* | 11/2013 | Burchard | B81C 99/0045 73/1.01 |
| 2014/0069214 A1* | 3/2014 | Kruckow | G01N 35/00 73/865.8 |
| 2014/0134748 A1* | 5/2014 | Liu | B01L 3/502707 436/150 |
| 2014/0138846 A1* | 5/2014 | Blanchard | H01L 21/76879 257/774 |
| 2014/0338459 A1* | 11/2014 | Besling | G01L 9/0073 73/718 |
| 2015/0005717 A1* | 1/2015 | Chappel | A61M 5/16881 604/247 |
| 2015/0122039 A1* | 5/2015 | Brown | G01L 9/0045 73/721 |
| 2015/0123129 A1* | 5/2015 | Teng | B81C 99/0045 257/48 |
| 2015/0153220 A1* | 6/2015 | Quer | G01P 15/097 73/579 |
| 2015/0204904 A1* | 7/2015 | Beyeler | G01D 5/12 324/750.25 |
| 2015/0284245 A1* | 10/2015 | Merrill, Jr. | B81C 99/005 73/865.9 |
| 2016/0107887 A1* | 4/2016 | Debeurre | G01L 27/005 438/14 |
| 2016/0116361 A1* | 4/2016 | Debeurre | G01L 27/005 73/1.58 |

FOREIGN PATENT DOCUMENTS

| | | | |
|---|---|---|---|
| JP | 05245967 | 9/1993 | |
| WO | WO 2010054676 A1 * | 5/2010 | |

OTHER PUBLICATIONS

Parameswaran et al., Silicon Pressure Sensors Using a Wafer-Bonded Sealed Cavity Process, Massachusetts Institute of Technology, the 8th International Conference on Solid-State Sensors and Actuators, and Eurosensors IX. Jun. 1995.*
Kistler, Increased Cost Efficiency with Cavity Pressure-Based Systems, www.kistler.com, Sep. 2014.*
BYU Mechanical Engineering, Introduction to Microelectromechanical Systems, www.compliantmechanism.byu.edu., Apr. 2011.*
Wang et al., A single-chip diaphragm-type miniature Fabry-Perot pressure sensor with improved cross-sensitivity to temperature, Nanyang Technological Univerity, IOP Publishing LTD 2004.*
Office Action U.S. Appl. No. 14/525,408; 7 Pages; Jun. 30, 2016.
Office Action from U.S. Appl. No. 14/525,408 (Oct. 12, 2016).

* cited by examiner

METHODOLOGY AND SYSTEM FOR WAFER-LEVEL TESTING OF MEMS PRESSURE SENSORS

TECHNICAL FIELD OF THE INVENTION

The present invention relates generally to microelectromechanical systems (MEMS) sensors. More specifically, the present invention relates to wafer-level testing of MEMS pressure sensors.

BACKGROUND OF THE INVENTION

Wafer-level testing is sometimes used in the semiconductor industry for evaluating results of wafer processing and for the selection of devices for assembly. Electrical testing of integrated circuits can, in some instances, provide sufficient information for selecting good chips. However, with MEMS devices, additional mechanical, optical, chemical, or other stimulus may be needed in order to verify proper functionality of MEMS devices and make sure that their parameters fall within the design specification.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

Embodiments of the present invention entail a test system and methodology for testing microelectromechanical systems (MEMS) devices at wafer-level. Such wafer-level testing provides the capability of determining critical mechanical and electrical characteristics of the MEMS devices, for example, MEMS pressure sensor devices. Embodiments provide the capability for verifying the strength and stiffness of each individual MEMS pressure sensor at wafer-level under a gauged pneumatic pressure stimulus. Embodiments further enable electrical die measurement at a gauged pressure stimulus, which can be used for functional die testing, and/or for calibration and compensation of the MEMS pressure sensor devices. Functional testing of MEMS pressure sensor devices at wafer-level can decrease the cost of the final product by rejecting bad MEMS pressure sensor devices before any assembly steps and/or for providing quick feedback to a product line.

Figure 1:
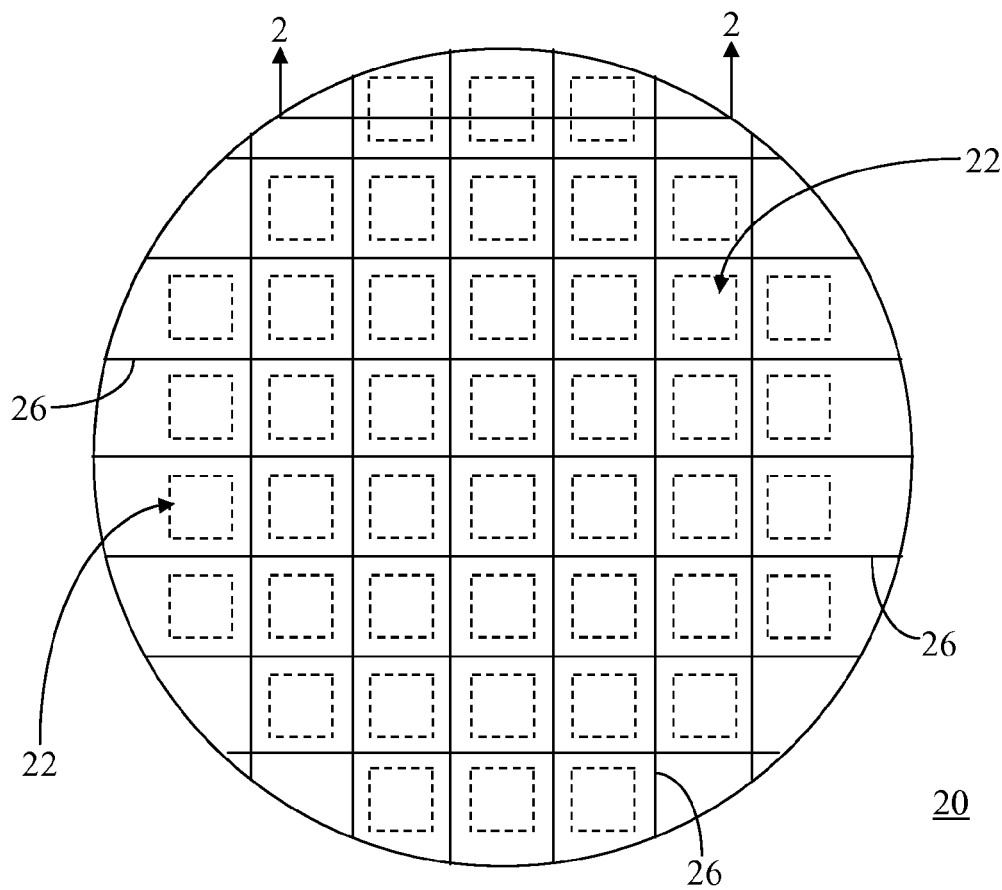
FIG. 1 shows a simplified top view of a device wafer having microelectromechanical systems (MEMS) devices formed thereon.
Figure 2:
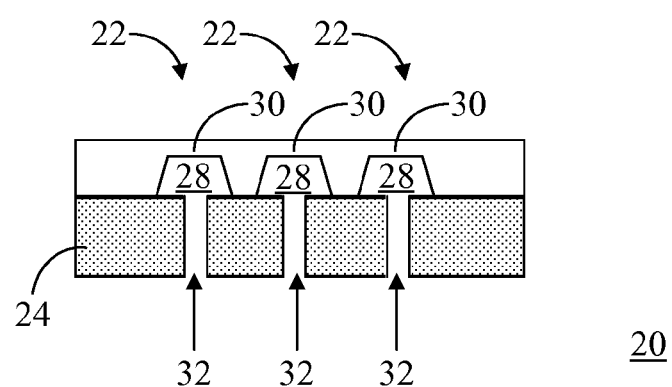
FIG. 2 shows a side view of the device wafer along section lines 2-2 in FIG. 1.

Referring to FIGS. 1 and 2, FIG. 1 shows a simplified top view of a MEMS device wafer 20 having a plurality of MEMS devices 22 formed thereon, and FIG. 2 shows a simplified side view of device wafer 20 along section lines 2-2 in FIG. 1. MEMS devices 22 (represented by dashed line squares in FIG. 1) may be formed in or on a substrate 24 by, for example, bulk or surface micromachining in accordance with known methodologies.

Boundaries of each of MEMS devices 22 are delineated in FIG. 1 by scribe lines, also known as die streets 26. Per convention, following fabrication of MEMS devices 22, MEMS device wafer 20 is sawn, diced, or otherwise separated into individual dies, each of which contains one of MEMS devices 22. The individual MEMS devices 22 can be packaged with other MEMS devices, application specific integrated circuits, and so forth in accordance with a particular package design. MEMS device wafer 20 includes only a few MEMS devices 22 for simplicity of illustration. Those skilled in the art will readily recognize that MEMS device wafer 20 can include any quantity of MEMS devices 22 in accordance with the diameter of substrate 24, the capability of a particular fabrication plant, and/or the size of MEMS devices 22.

In an embodiment, MEMS devices 22 are pressure sensors, each having, for example, a pressure cavity 28 and a membrane element, referred to as a diaphragm 30, that deflects under pressure. Accordingly, MEMS devices 22 are referred to hereinafter as MEMS pressure sensors 22. A port 32 may extend through substrate 24 into each pressure cavity 28. These ports 32 may be utilized to facilitate fabrication of diaphragm 30 and pressure cavity 28 in connection with micromachining techniques. In accordance with an embodiment, ports 32 can additionally be used for various wafer-level test methodologies, as will be discussed in significantly greater detail below. Following the wafer-level test processes, ports 32 may be utilized in a differential pressure sensor configuration.

The following discussion pertains to a test system and methodology for wafer-level testing of MEMS pressure sensors. In the ensuing discussion, wafer-level testing is described in connection with testing the differential pressure sensor configuration shown above. However, it should be understood that the test system and methodology can alternatively be utilized for the wafer-level testing of an absolute pressure sensor configuration. Such a configuration will be discussed below in connection with FIG. 13.

Figure 3:
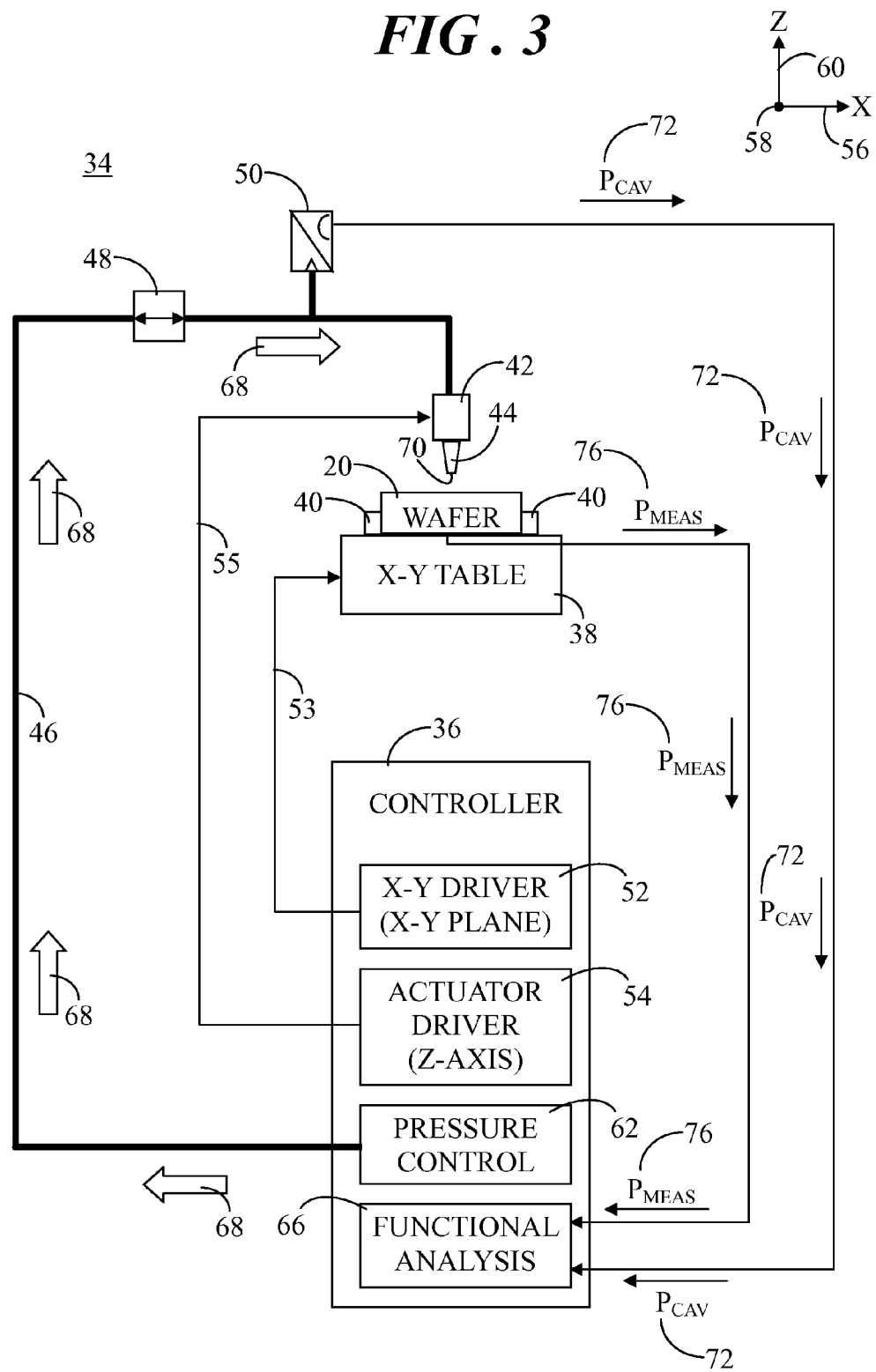
FIG. 3 shows a block diagram of an exemplary test system for performing wafer-level testing of the wafer of FIG. 1.

FIG. 3 shows a block diagram of an exemplary test system 34 for performing wafer-level testing of MEMS device wafer 20 (FIG. 1). Test system 34 generally includes a controller 36 and a movable X-Y stage referred to herein as an X-Y table 38. A wafer chuck 40 is coupled to X-Y table 38. Wafer chuck 40 is adapted to retain MEMS device wafer 20. Test system 34 further includes an actuator 42 having a nozzle 44, a fluid supply line 46 in communication with actuator 42, a nozzle valve 48, and an in-line pressure sensor 50.

Controller 36 includes an X-Y driver module 52 in communication with X-Y table 38 via a signal line 53. X-Y driver module 52 is adapted to provide control signals to X-Y table 38 in order to move (i.e., index) X-Y table 36 substantially parallel to an X-Y plane of test system 34. Controller 36 additionally includes an actuator driver module 54 in communication with actuator 42 via a signal line 55. In an embodiment, actuator driver module 54 is adapted to provide control signals to actuator 42 in order to move actuator 42 and nozzle 44 in proximity to wafer 20. More particularly, actuator 42 and nozzle 44 are driven toward wafer 20 along an axis, e.g., the Z-axis, substantially perpendicular to the orientation of X-Y table 36. In the illustration of FIG. 3, a three-dimensional coordinate system is represented in which an X-axis 56 is oriented rightward and leftward on the page, a Y-axis 58 is directed inward into the page, and a Z-axis 60 is directed upward and downward on the page. Together, X-axis 56 and Y-axis 58 define the planar X-Y direction of movement of X-Y table 36, and Z-axis 60 defines the Z-axis direction of movement of nozzle 44.

An exemplary configuration is described in which actuator 42 undergoes Z-axis motion so as to move nozzle 44 toward MEMS device wafer 20. However, in an alternative embodiment, table 36 may be configured for three dimensional movement so as to move MEMS device wafer 20 toward nozzle 44. Still other hardware implementations may be utilized to provide the Z-axis motion so as to move nozzle 44 and MEMS device wafer 20 toward one another.

In-line pressure sensor 50 is in communication with fluid supply line 46 and is interposed between nozzle valve 48 and nozzle 44. In-line pressure sensor 50 is capable of detecting pressure within fluid supply line 46. As will be discussed in connection with the testing methodology described below, pressure within fluid supply line 46 sensed by in-line pressure sensor 50 corresponds to a pressure within a cavity associated with one of MEMS pressure sensors 22 (FIG. 1) in response to a pneumatic pressure stimulus (discussed below). In this differential pressure sensor example, the cavity associated with one of MEMS pressure sensors 22 is pressure cavity 28 (FIG. 2) of one of MEMS pressure sensors 22 (FIG. 1). Therefore, the pressure sensed by in-line pressure sensor 50 corresponds to the pressure applied to diaphragm 30 from within pressure cavity 28. The sensed pressure can be utilized to test the strength and stiffness of diaphragm 30 (FIG. 2) of each of MEMS pressure sensors 22 (as discussed in connection with FIGS. 5 and 8).

Controller 36 further includes a pressure control module 62 and a functional analysis module 66. Pressure control module 62 is adapted to control a magnitude of a pneumatic pressure stimulus 68 communicated via fluid supply line 46 to an outlet 70 of nozzle 44. Functional analysis module 66 is in communication with in-line pressure sensor 50 and is adapted to receive a pressure signal 72, labeled $P_{CAV}$, corresponding to a magnitude of a cavity pressure within one of pressure cavities 28. Functional analysis module 66 may also be in communication with a probe system, a wiring bus 74 connected to X-Y table 38, or any other structure for conveying an output pressure signal 76, labeled $P_{MEAS}$, from at least one of MEMS pressure sensors 22 to functional analysis module 66. Output pressure signal 76 may be utilized to determine an individual calibration factor for each of MEMS pressure sensors 22 on MEMS device wafer 20 (discussed in connection with FIG. 10).

It should be understood that X-Y driver 52, actuator driver 54, pressure control module 62 and functional analysis module 66 may be implemented in software, hardware, or a combination of software and hardware. Additionally, although controller 36 is shown to include each of X-Y driver 52, actuator driver 54, pressure control module 62 and functional analysis module 66, it should be understood that elements 52, 54, 62, and 66 may be implemented in more than one controller or processor located proximate to or more distant from X-Y table 38.

Figure 4:
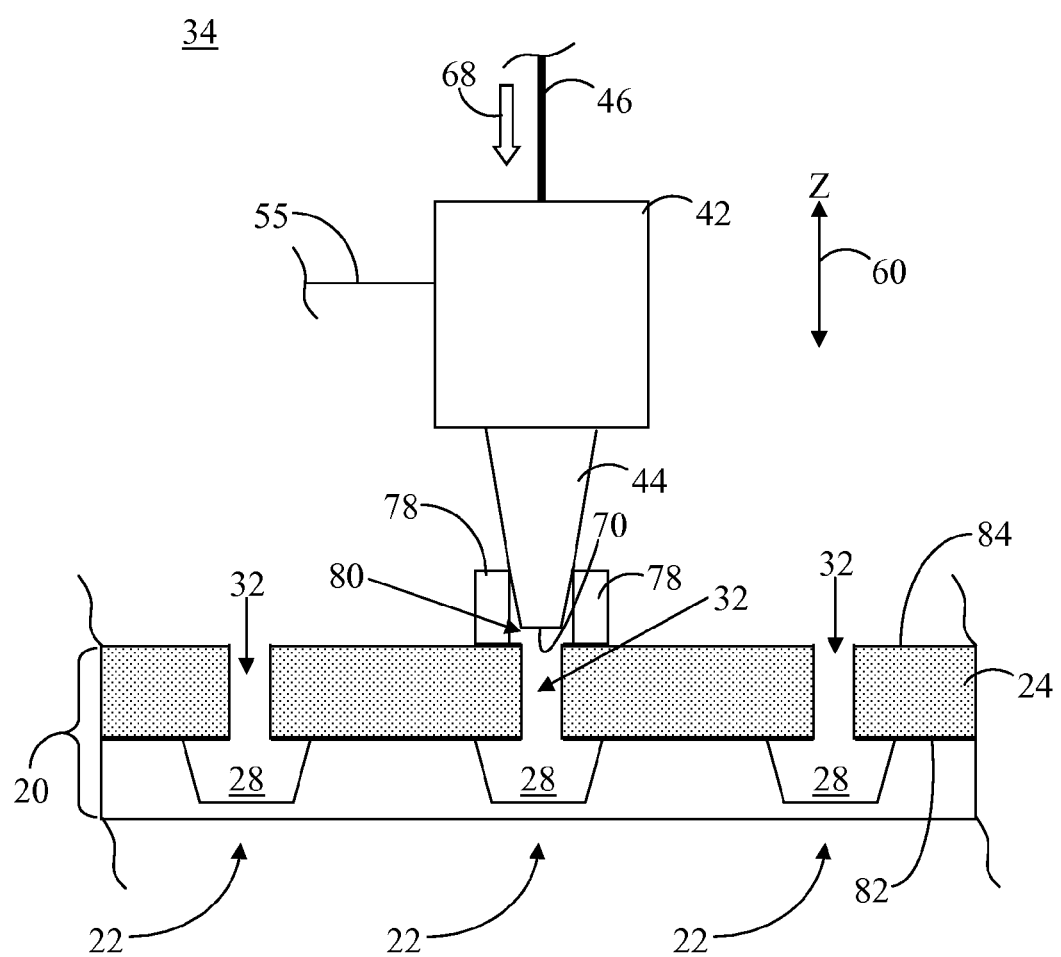
FIG. 4 shows an enlarged partial view of the test system with a nozzle utilized to apply a pneumatic pressure stimulus the pressure sensors formed on the MEMS device wafer.

FIG. 4 shows an enlarged partial view of test system 34 with nozzle 44 utilized to apply pneumatic pressure stimulus 68 to MEMS pressure sensors 22 formed on MEMS device wafer 20. Only a few MEMS pressure sensors 22 and a portion of MEMS device wafer 20 are shown for simplicity of illustration in the partial enlarged view of FIG. 4. Additionally, test system 34 is shown with a single nozzle for simplicity of illustration. In alternative embodiments, test system 34 may include multiple nozzles and associated components so that multiple MEMS pressure sensors 22 may be concurrently tested. In an embodiment, nozzle 44 is directed by signals received via signal line 55 to move along Z-axis 60 toward port 32 in substrate 24 of MEMS device wafer 20. Test system 34 further includes a seal element 78 surrounding outlet 70 of nozzle 44. An opening 80 extends through seal element 78 in which outlet 70 of nozzle 44 is located.

In the illustrated example, MEMS pressure sensors 22 are located on one side 82 of substrate 24. Seal element 78 is placed in contact with an opposing side 84 (i.e., a back side) of substrate 24 surrounding port 32. As nozzle 44 is driven toward substrate 24, mechanical force is applied to seal element 78 to form a pressure seal between side 84 of substrate 24 and seal element 78. Accordingly, pressure cavity 28 at least temporarily becomes a sealed pressure chamber for purposes of wafer-level testing. Thus, pneumatic pressure stimulus 68 can be applied to diaphragm 30 via port 32 and into the sealed pressure cavity 28. In general, the pressure within sealed pressure cavity 28 changes in response to pneumatic pressure stimulus 68, and this pressure, i.e., pressure signal 72 (FIG. 3), can be detected by inline pressure sensor 50 and can be used to test the strength and/or stiffness of diaphragm 30.

Figure 5:
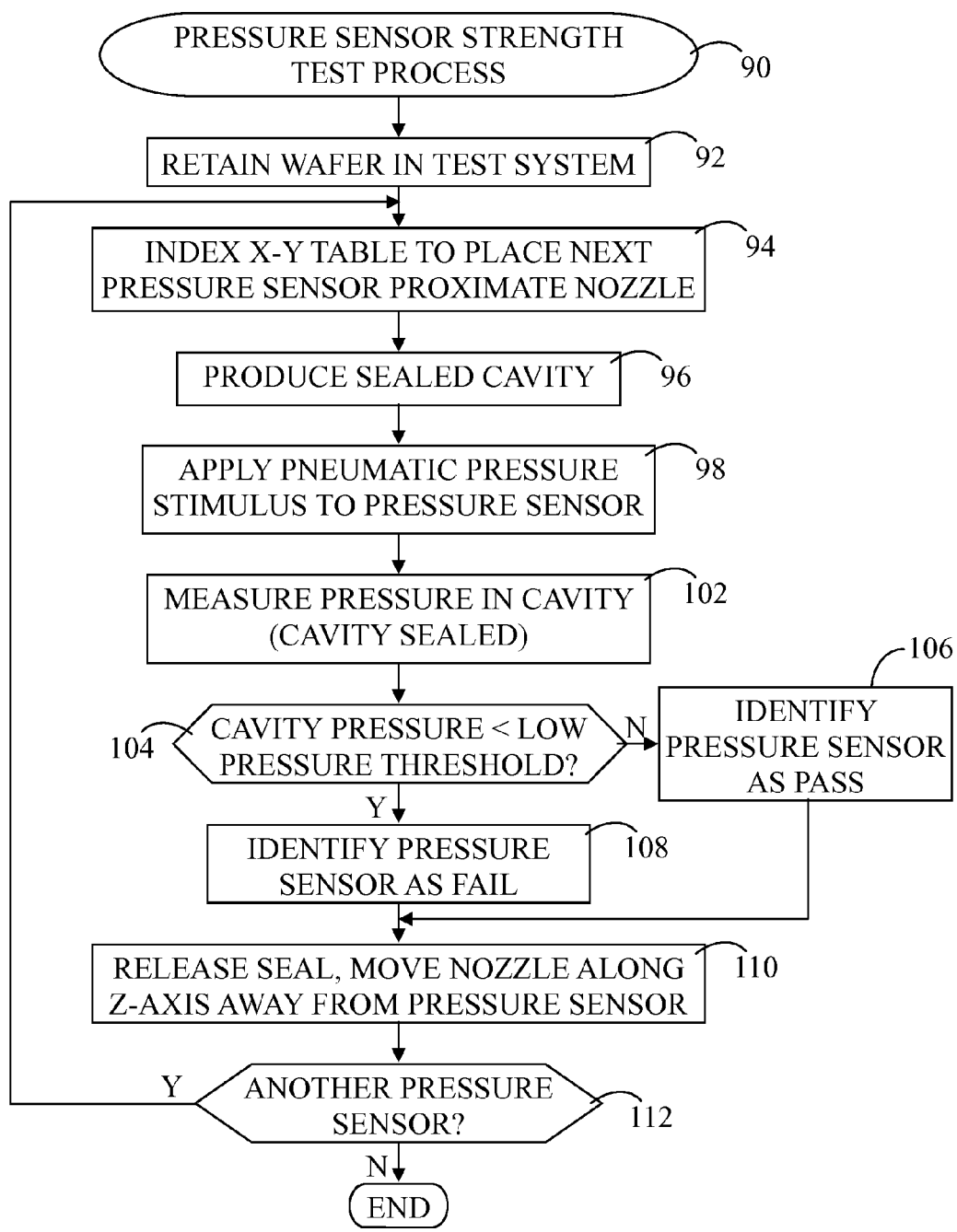
FIG. 5 shows a flowchart of a pressure sensor strength test process in accordance with an embodiment.

Referring concurrently to FIGS. 3-5, FIG. 5 shows a flowchart of a pressure sensor strength test process 90 in accordance with an embodiment. Pressure sensor strength test process 90 may be a software application of pressure control module 62 (FIG. 3) that is executed by controller 36 (FIG. 3). Process variation on critical design parameters, such as the thickness of a MEMS pressure sensor diaphragm, can affect the strength of the diaphragm. For example, a small decrease in the thickness of a MEMS pressure sensor diaphragm, relative to a design thickness, can significantly decrease its strength, relative to the predetermined nominal, or design, strength for the diaphragm. Accordingly, pressure sensor strength test process 90 is a destructive test executed at wafer-level to identify those MEMS pressure sensors 22 (FIG. 1) having diaphragms 30 (FIG. 2) of insufficient strength to withstand a particular design pressure.

Execution of process 90 entails retaining (92) MEMS device wafer 20 in wafer chuck 40 of X-Y table 38 and moving (94), i.e., indexing, X-Y table 38 along X-axis 56 and/or Y-axis 58 to place a next one of MEMS pressure sensors 22 in proximity to nozzle 44. Of course, during a first iteration of step 94, the "next one" of MEMS pressure sensors 22 will be a first pressure sensor 22. Once one of MEMS pressure sensors 22 is placed in proximity to nozzle 44, a sealed cavity is produced (96). In accordance with the differential configuration of MEMS pressure sensors 22, port 32 of MEMS pressure sensor 22 is sealed to form a sealed pressure cavity 28. As discussed above in connection with FIG. 4, nozzle 44 may be moved along Z-axis 60 toward MEMS device wafer 20, seal element 78 is positioned surrounding port 32 and in contact with side 84 of substrate 24, and mechanical force is applied to seal element to form a pressure seal between side 84 of substrate 24 and seal element 78, thereby forming a sealed pressure cavity 28.

Thereafter, pneumatic pressure stimulus 68 is applied (98) to diaphragm 30 of the particular MEMS pressure sensor 22 under test via port 32 and pressure cavity 28. Pneumatic pressure stimulus 68 may be air or another suitable fluid material that is provided via fluid supply line 46 from pressure control module 62 of controller 36, or a subsystem associated with pressure control module 62. In an embodiment, the magnitude or level of pneumatic pressure stimulus 68 applied to MEMS pressure sensor 22 may be at least equivalent to or greater than a maximum pressure rating for MEMS pressure sensors 22. The maximum pressure rating may be a design parameter specific to MEMS pressure sensors 22. Stress is applied to diaphragm 30 by outputting pneumatic pressure stimulus 68 from outlet 70 of nozzle 44 through port 32 and into pressure cavity 28.

After a pre-determined settling time, application of pneumatic pressure stimulus 68 may be discontinued, for example, by closing nozzle valve 48. The pressure in pressure cavity 28 is measured (102). The pressure in pressure cavity 28 is the pressure imposed upon diaphragm 30 by pneumatic pressure stimulus 68. That is, following closure of nozzle valve 48, a closed system is produced between nozzle valve 48 and diaphragm 30. In-line pressure sensor 50, located between nozzle valve 48 and diaphragm 30, measures the pressure in that portion of fluid supply line 46. Due to the closed system configuration, the pressure in fluid supply line 46 downstream from nozzle valve 48 will be substantially the same as the magnitude of the pressure in pressure cavity 28, which is the pressure imposed upon diaphragm 30. In-line pressure sensor 50 produces cavity pressure signal 72, which can be communicated to functional analysis module 66.

At functional analysis module 66, a determination (104) is made as to whether cavity pressure signal 72 is outside of a passing range, wherein the passing range is defined by a low pressure threshold and a high pressure threshold. In this example, when cavity pressure signal 72 is greater than a low pressure threshold value then a conclusion can be reached that diaphragm 30 was not broken, cracked, or otherwise breached prior to or during the application of pneumatic pressure stimulus 68. If such is the case, MEMS pressure sensor 22 is identified (106) as having passed its strength test. That is, diaphragm 30 of MEMS pressure sensor 22 is intact. Alternatively, when cavity pressure signal 72 is less than the low pressure threshold value then a conclusion can be reached that diaphragm 30 was broken, cracked, or otherwise breached prior to or during the application of pneumatic pressure stimulus 68. If such is the case, MEMS pressure sensor 22 is identified (108) as having failed its strength test. That is, MEMS pressure sensor 22 is non-functional, i.e., defective.

Following either of tasks 106 and 108, seal element 78 is released and nozzle 44 is moved (110) along Z-axis 60 away from the particular MEMS pressure sensor 22 under test. A determination (112) is made as to whether there is another MEMS pressure sensor 22 on MEMS device wafer 20 to be tested. When there is another MEM pressure sensor 22, program control loops back to index (94) X-Y table 38 to the next MEMS pressure sensor 22 and repeat the testing for the next MEMS pressure sensor 22. Once all MEMS pressure sensors 22 on MEMS wafer device 20 have been tested, pressure sensor strength test process 90 ends for that particular MEMS device wafer 20. After all MEMS pressure sensors 22 have been tested, additional tasks can include removal of MEMS device wafer 20 from X-Y table 38, marking the defective MEMS pressure sensors 22, and so forth.

Figure 6:
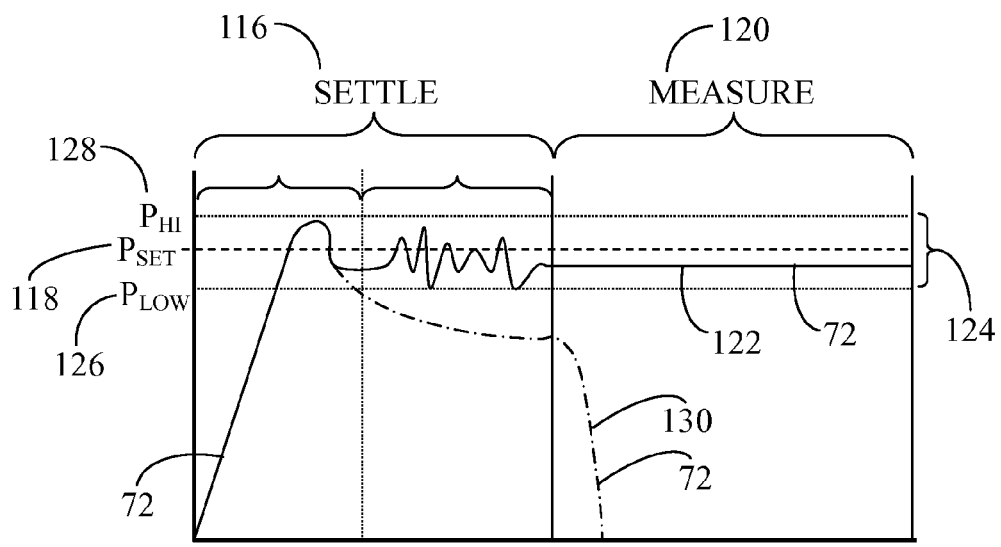
FIG. 6 shows a chart exemplifying the application and subsequent measurement of the pneumatic pressure stimulus during testing.

FIG. 6 shows a chart 114 exemplifying the application and subsequent measurement of the pneumatic pressure stimulus 68 during testing in accordance with pressure sensor strength test process 90 (FIG. 5). Pneumatic pressure stimulus 68 can be applied for a stimulus period 116 to allow pressure signal 72 from in-line pressure sensor 50 to settle or otherwise become stable. In this example, stimulus period 116 may be approximately five hundred milliseconds in which pneumatic pressure stimulus 68 may be ramped up until a set-point pressure 118, labeled $P_{SET}$, is reached. This may take approximately two hundred milliseconds of stimulus period 116 to reach set-point pressure. The remaining portion of stimulus period 116 provides a time lag prior to measurements from in-line pressure sensor being received and analyzed. Stimulus period 116 terminates when nozzle valve 48 is closed.

After nozzle valve 48 is closed, a measurement period 120 commences. In-line pressure sensor 50 now begins to measure the pressure imposed on diaphragm 30. A solid trace 122 in chart 114 represents a passing diaphragm 30 in which, following closure of nozzle valve 48, pressure signal 72 remains within a passing range 124 defined by a low pressure threshold 126 and a high pressure threshold 128. In contrast, a dash-dot trace 130 in chart 114 represents a failing diaphragm 30 in which, following closure of nozzle valve 48, pressure signal 72 is outside of passing range 124. More particularly, pressure signals 72 falls below low pressure threshold 126 to, for example, zero. Thus, dash-dot trace 130 of pressure signal 72 represents a condition in which diaphragm 30 for a particular one of MEMS pressure sensors 22 was broken, cracked, or otherwise breached prior to or during the application of pneumatic pressure stimulus 68.

Figure 7:
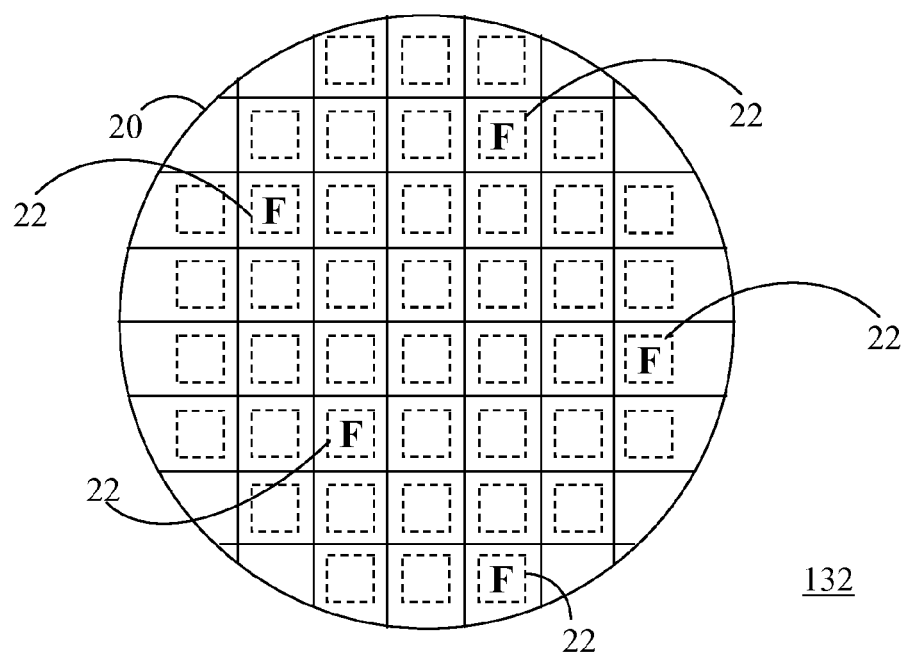
FIG. 7 shows a top view of an exemplary substrate map of defective pressure sensors identified in accordance with the execution of the pressure sensor strength test process.

FIG. 7 shows a top view of an exemplary substrate map 132 of defective pressure sensors 22 identified in accordance with the execution of pressure sensor strength test process 90 (FIG. 5). Substrate map 132 shows a rendition of MEMS device wafer 20 in which the locations of defective MEMS pressure sensors 22 are demarcated with an "F" identifying them as having failed the destructive testing of strength test process 90. Substrate map 132 may be generated electronically or on hard copy. Alternatively, substrate map 132 for MEMS device wafer 20 may simply entail markings on MEMS device wafer 20 that identify the defective ones of MEMS pressure sensors 22. The information derived from the execution of pressure sensor strength test process 90 can be used during further packaging processes generally described in connection with FIG. 11.

Figure 8:
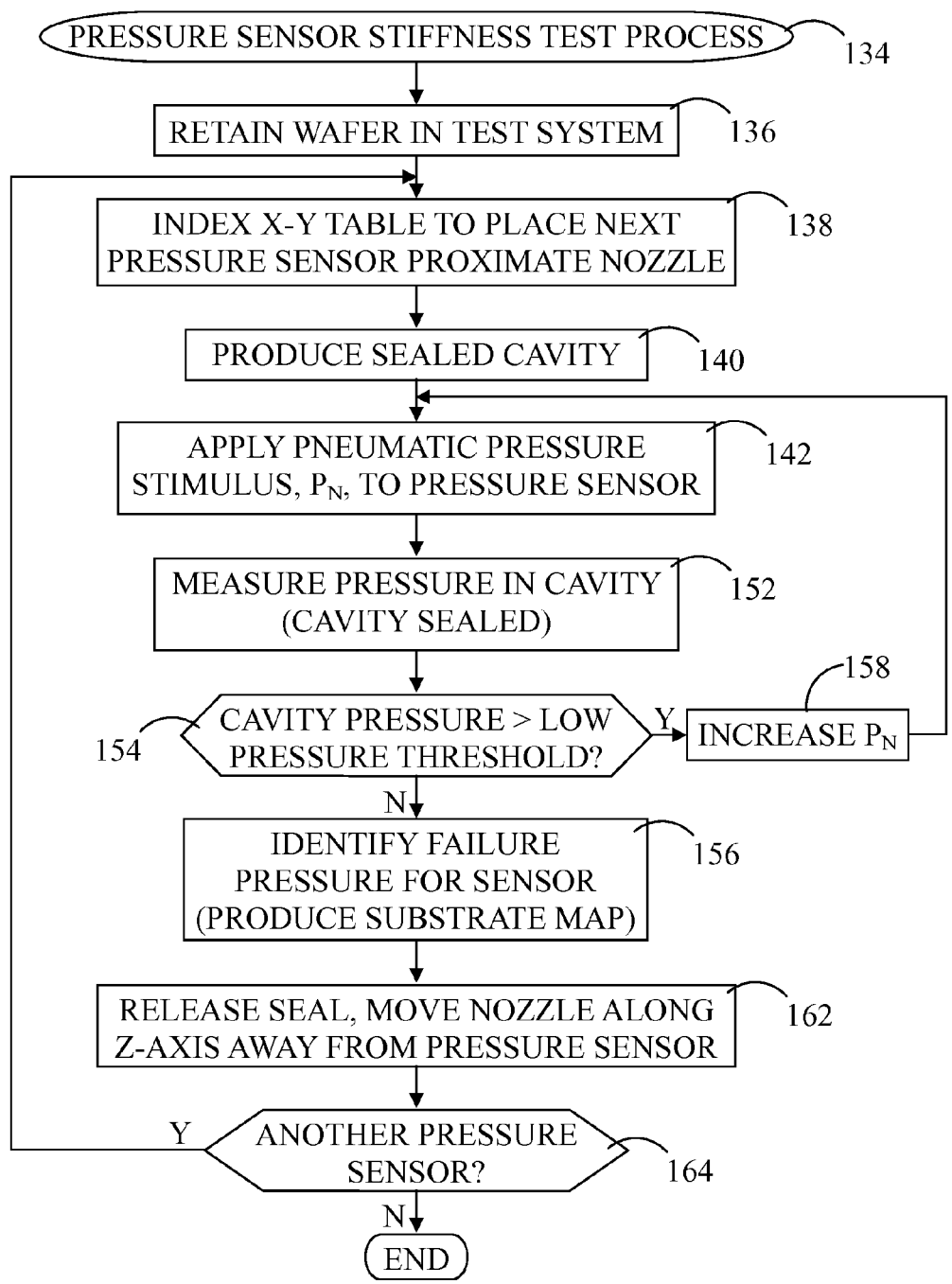
FIG. 8 shows a flowchart of a pressure sensor stiffness test process in accordance with another embodiment.

Referring concurrently to FIGS. 3, 4, and 8, FIG. 8 shows a flowchart of a pressure sensor stiffness test process 134 in accordance with another embodiment. Pressure sensor stiffness test process 134 may be a software application of pressure control module 62 that is executed by controller 36. Process variation on critical design parameters can also affect the stiffness of the diaphragm. Differences in the stiffness of diaphragms across a MEMS device wafer can result in differing device performance. Accordingly, pressure sensor stiffness test process 134 is a destructive test executed at wafer-level on a test wafer, and the knowledge gleaned from the testing may be used for adjusting production processes. Additionally or alternatively, the knowledge gleaned from execution of stiffness test process 134 can be used in "product binning" of the MEMS pressure sensors.

In semiconductor device fabrication, product "binning" is a process of categorizing finished products based on various characteristics. Binning allows large variances in performance to be condensed into a smaller number of marketed designations. This ensures coherency in the marketplace, with tiers of performance clearly delineated. The immediate consequence of this practice is that, for liability reasons, products sold under a certain designation must meet that designation at a minimum, although products may still exceed advertised performance.

Execution of process 134 entails retaining (136) a MEMS device wafer, e.g., MEMS device wafer 20, in wafer chuck 40 of X-Y table 38, indexing (138) X-Y table 38 along X-axis 56 and/or Y-axis 58 to place a next one of MEMS pressure sensors 22 in proximity to nozzle 44, and producing (140) a sealed cavity. In this example, port 32 is sealed to form a sealed pressure cavity 28. Steps 136, 138, and 140 are generally performed in a manner similar to that described above in connection with steps 92, 94, and 96 of pressure sensor strength test process 90 (FIG. 5). Thereafter, pneumatic pressure stimulus 68 is applied (142) to diaphragm 30 of the particular MEMS pressure sensor 22 under test via port 32 and pressure cavity 28. During a first iteration of stiffness test process 134, pneumatic pressure stimulus 68 is applied at an initial magnitude 144 (see FIG. 9). In this example, initial magnitude 144, or pressure level, of pneumatic pressure stimulus 68 is 600 kPaG. However, any suitable magnitude may be selected in accordance with the design parameters of MEMS pressure sensors 22 under test.

After a pre-determined settling time, application of pneumatic pressure stimulus 68 may be discontinued by closing nozzle valve 48, and the magnitude of the pressure in pressure cavity 28 is measured (152). The pressure in pressure cavity 28 is the pressure imposed upon diaphragm 30 by pneumatic pressure stimulus 68. Again, a closed system is produced between nozzle valve 48 and diaphragm 30 following closure of nozzle valve 48 and in-line pressure sensor 50 measures the pressure in that portion of fluid supply line 46. Due to the closed system configuration, the pressure in fluid supply line 46 downstream from nozzle valve 48 will be substantially the same as the pressure in pressure cavity 28, which is the pressure imposed upon diaphragm 30. In-line pressure sensor 50 produces cavity pressure signal 72, which can be communicated to functional analysis module 66.

Figure 9:
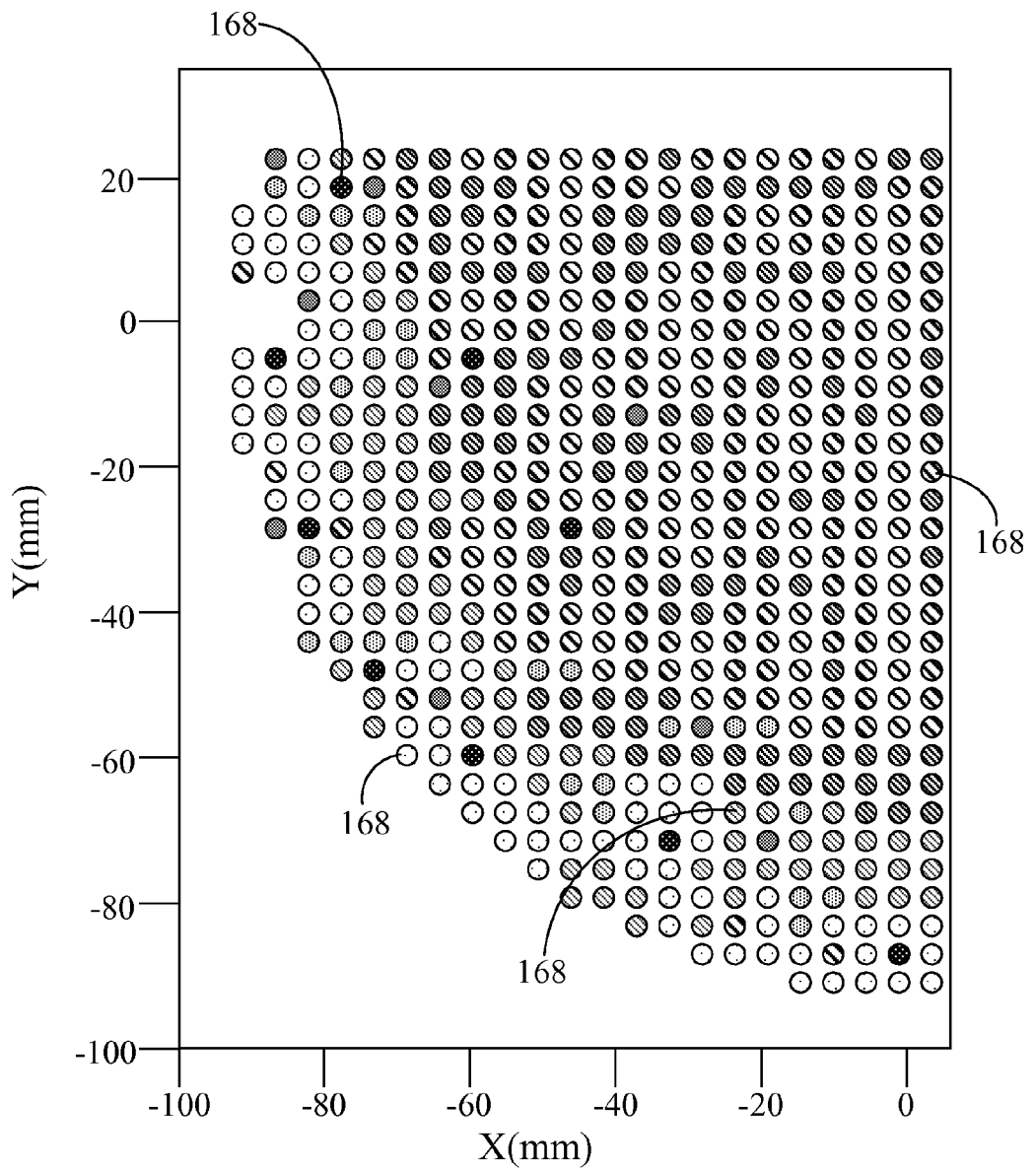
FIG. 9 shows a portion of a substrate map produced in accordance with the execution of the pressure sensor stiffness test process.

At functional analysis module 66, a determination (154) is made as to whether cavity pressure signal 72 is within of a passing range, which in this example, is greater than a low pressure threshold value. When cavity pressure signal 72 is less than a pressure threshold value then a conclusion can be reached that diaphragm 30 was broken, cracked, or otherwise breached prior to or during the application of pneumatic pressure stimulus 68 at the particular magnitude, such as initial magnitude 144 (FIG. 9). The pressure threshold can be some predetermined passing range defined by a low pressure threshold and a high pressure threshold, where the range is centered at the magnitude of the pneumatic pressure stimulus 68 at the current iteration of process 134. When cavity pressure signal 72 is less than the low pressure threshold value, MEMS pressure sensor 22 is identified (156) as having failed and this result may be recorded in a substrate map (discussed below).

Alternatively, when a determination (154) is made that cavity pressure signal 72 is greater than the low pressure threshold value then a conclusion can be reached that diaphragm 30 was not broken, cracked, or otherwise breached prior to or during the application of pneumatic pressure stimulus 68 at the particular magnitude, such as pressure level 144 (FIG. 9). Accordingly, the magnitude of pneumatic pressure stimulus 68 is increased (158) to a successively higher magnitude 160 (see FIG. 9), or pressure level. Process control loops back to task 142 to apply pneumatic pressure stimulus 68 at the successively higher magnitude 160, to measure (152) the pressure in the cavity, and to determine (154) whether the cavity pressure is greater than a low pressure threshold. Accordingly, tasks 142, 152, 154, and 158 can be repeated, applying successively greater magnitudes of pneumatic pressure stimulus 68 until diaphragm 30 fails for the pressure sensor 22 being tested.

When the determination (154) is made that MEMS pressure sensor 22 has failed and the particular MEMS pressure sensor 22 under test is identified at step 156 in the substrate map, seal element 78 is released and nozzle 44 is moved (162) along Z-axis 60 away from the particular MEMS pressure sensor 22 under test. A determination (164) is made as to whether there is another MEMS pressure sensor 22 on MEMS device wafer 20 to be tested. When there is another MEM pressure sensor 22, program control loops back to index (138) X-Y table 38 to the next MEMS pressure sensor 22 and repeat the testing for the next MEMS pressure sensor 22. Once all MEMS pressure sensors 22 on MEMS wafer device 20 have been tested, pressure sensor stiffness test process 134 ends for that particular MEMS device wafer 20 and MEMS device wafer 20 is removed from X-Y table 38.

FIG. 9 shows a portion of a substrate map 166 produced in accordance with the execution of pressure sensor stiffness test process 134 (FIG. 8). The portion of substrate map 166 corresponds to approximately one quarter of the corresponding MEMS device wafer 20 for simplicity of illustration. In the exemplary substrate map 166, a location 168 of each of MEMS pressure sensors 22 is individually shaded to represent its failure pressure. A legend 170 shows a number of failure pressures 172 and a particular shading icon 174 associated with each failure pressure 172. Gauged pressure profiles are applied on each MEMS pressure sensor 22 at wafer-level in accordance with the execution of pressure sensor stiffness test process 134 (FIG. 8). The stiffness of each diaphragm 30 is confirmed versus the specified pressure and the failure of each diaphragm 30 at each location 168 is recorded in substrate map 166 in association with its failure pressure 172. Additional statistics may be derived from substrate map 166 including, for example, quantities of sensor failures at each failure pressure 172, specific locations of undesirably large quantities of sensor failures at relatively low failure pressures 172, and so forth. This data can be provided to manufacturing in order to adjust fabrication processes in a product line. Alternatively, this data can be utilized to bin or categorize MEMS pressure sensors 22. An exemplary binning process using information derived from the execution of pressure sensor stiffness test process 134 is generally described below in connection with FIG. 12.

Figure 10:
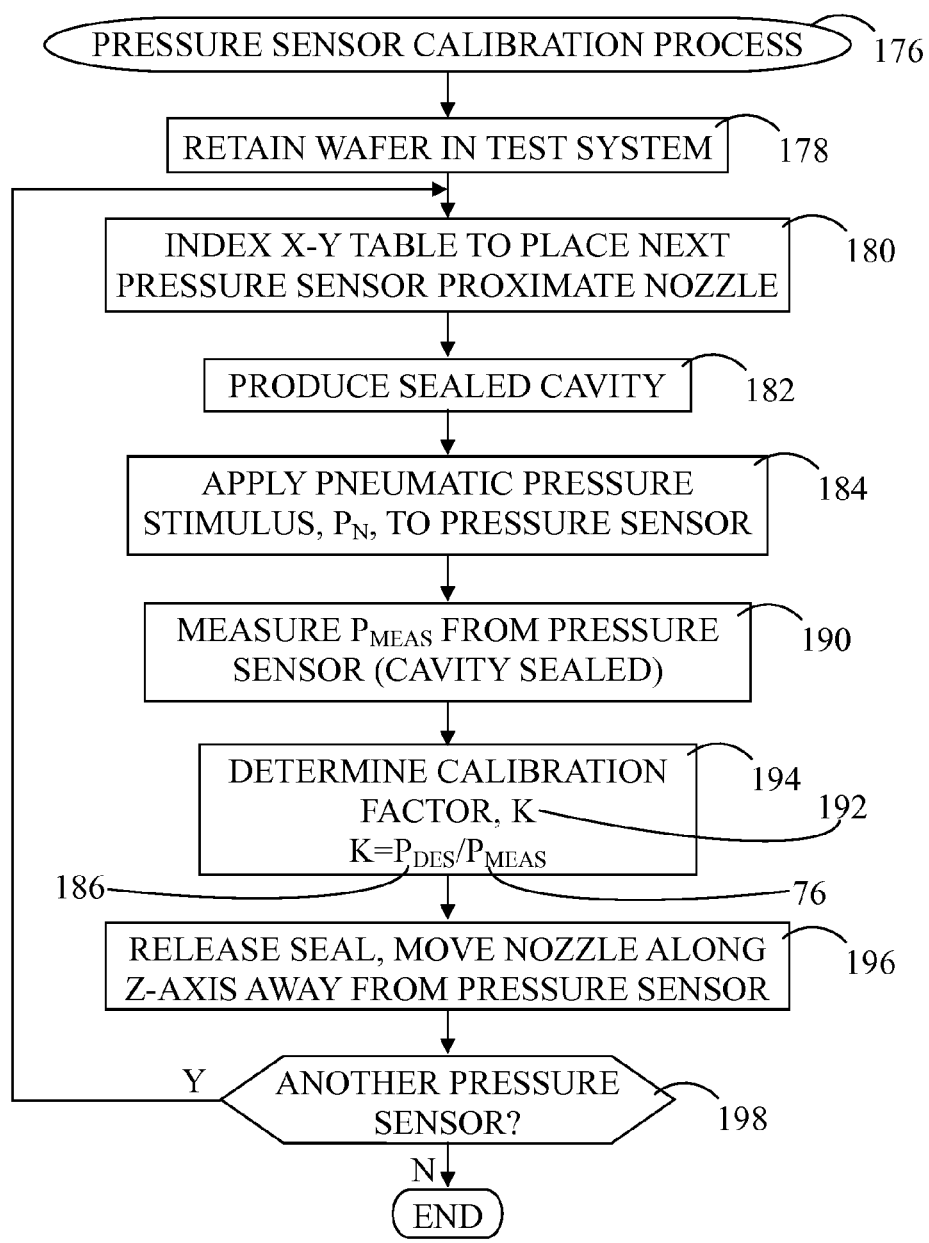
FIG. 10 shows a pressure sensor calibration factor determination process in accordance with another embodiment.

Referring concurrently to FIGS. 3, 4, and 10, FIG. 10 shows a pressure sensor calibration factor determination process 176 in accordance with another embodiment. Pressure sensor calibration factor determination process 176 may be a software application of pressure control module 62 that is executed by controller 36. Process variation on critical design parameters can affect the sensitivity of a pressure sensor. For example, a small difference in the width of a MEMS pressure sensor diaphragm can result in a large difference in sensitivity, relative to the predetermined nominal, or design, sensitivity for the pressure sensor. Accordingly, the sensitivity of each MEMS pressure sensor is typically calibrated individually. Pressure sensor calibration factor determination process 176, executed at test system 34, may utilized to individually calibrate each of MEMS pressure sensors 22 at wafer-level.

Execution of process 176 entails retaining (178) a MEMS device wafer, e.g., MEMS device wafer 20, in wafer chuck 40 of X-Y table 38, indexing (180) X-Y table 38 along X-axis 56 and/or Y-axis 58 to place one of MEMS pressure sensors 22 in proximity to nozzle 44, and producing (182) a sealed cavity (sealing port 32 to form a sealed pressure cavity 28) in a manner similar to that described above in connection with steps 92, 94, and 96 of pressure sensor strength test process 90 (FIG. 5) and steps 136, 138, and 140 of pressure sensor stiffness test process 134 (FIG. 8).

Thereafter, pneumatic pressure stimulus 68 is applied (184) to diaphragm 30 of the particular MEMS pressure sensor 22 under test via port 32 and pressure cavity 28. In accordance with an embodiment, pneumatic pressure stimulus 68 may be applied at a pressure level designed to produce a particular output pressure signal, referred to herein as a design output pressure signal 186, labeled $P_{DES}$ in FIG. 10, from MEMS pressure sensor 22.

After a pre-determined settling time, application of pneumatic pressure stimulus 68 may be discontinued by closing nozzle valve 48, and the output pressure signal 76, $P_{MEAS}$, from MEMS pressure sensor 22 is measured (190) and is communicated to, for example, functional analysis module 66. At functional analysis module 66, a calibration factor 192, labeled K, is determined (194) for the particular MEMS pressure sensor 22 being tested. Calibration factor 192 is simplistically shown as being a function of design output pressure signal 186, $P_{DES}$, divided by the measured output pressure signal 76, $P_{MEAS}$. Those skilled in the art will recognize that any suitable computation may be implemented for determining calibration factor 192 for the particular MEMS pressure sensor 22 being tested using one or more design output pressure signals 186 and the corresponding one or more measured output pressure signals 76. The determined calibration factor 192 may be associated with the particular one of MEMS pressure sensors 22 under test and may be stored in, for example, a substrate map, a table, a database, or any other record.

Thereafter, seal element 78 is released and nozzle 44 is moved (196) along Z-axis 60 away from the particular MEMS pressure sensor 22 under test. A determination (198) is made as to whether there is another MEMS pressure sensor 22 on MEMS device wafer 20 for which calibration factor 192 is to be determined. When there is another MEMS pressure sensor 22, program control loops back to index (180) X-Y table 38 to the next MEMS pressure sensor 22 and repeat the tasks for determining calibration factor 192 for the next MEMS pressure sensor 22. Once calibration factors 192 have been determined for all MEMS pressure sensors 22 on MEMS wafer device 20, pressure sensor calibration factor determination process 134 ends for that particular MEMS device wafer 20 and MEMS device wafer 20 can be removed from X-Y table 38.

Figure 11:
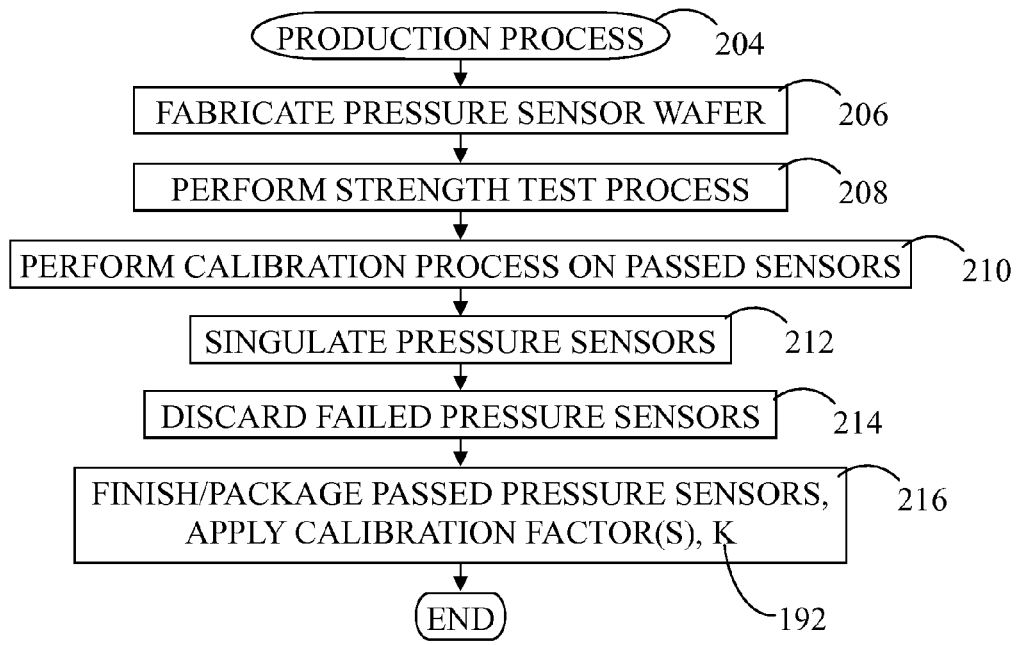
FIG. 11 shows a flowchart of an exemplary production process that incorporates the strength test process and the calibration factor determination process.

FIG. 11 shows a flowchart of an exemplary production process 204 that incorporates strength test process 90 (FIG. 4) and calibration factor determination process 176 (FIG. 10). Production process 204 is described in connection with the production of a single MEMS device wafer for simplicity of illustration. Those skilled in the art will recognize that production process 204 may be executed for a plurality of MEMS device wafers in a manufacturing facility.

Production process 204 entails fabrication (206) of a MEMS device wafer. In this example the MEMS device wafer may be a MEMS pressure sensor wafer having a plurality of pressure sensors formed thereon. While still at wafer-level, strength test process 90 (FIG. 5) is performed (208) to identify those pressure sensors on the MEMS pressure sensor wafer that are defective. Again, while still at wafer-level, calibration factor determination process 176 (FIG. 10) may be performed (210) to determined calibration factor 192 for each of the MEMS pressure sensors that passed strength test process 90.

Following all wafer-level operations, the MEMS pressure sensor wafer is diced, cut, sawn or otherwise separated to singulate (212) the pressure sensor dies on the MEMS pressure sensor wafer. The singulated pressure sensor dies that were identified as not passing, i.e., failing, strength test process 90 (FIG. 5) are discarded (214), and the singulated pressure sensor dies that were identified as passing strength test process 90 can be finished and packaged (216), and their individual calibration factors 192 can be suitably applied. Thereafter, production process 204 ends. Those skilled in the art will recognize that production process 204 can have additional operations, not shown herein for simplicity of illustration.

Figure 12:
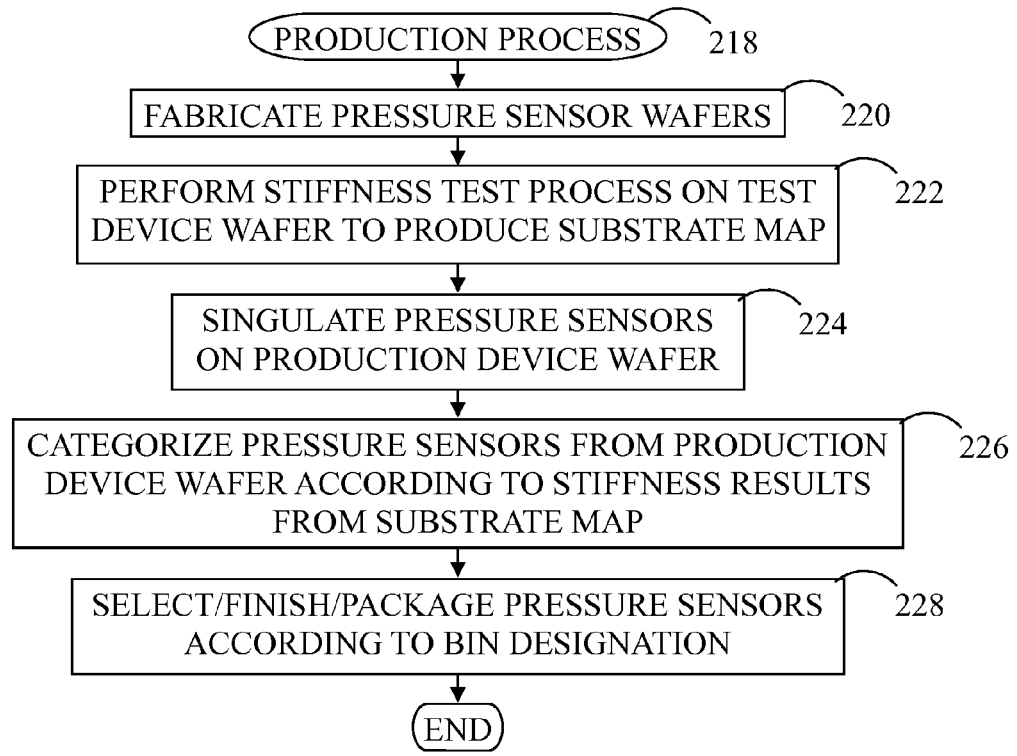
FIG. 12 shows a flowchart of an exemplary production process that incorporates the stiffness test process.

FIG. 12 shows a flowchart of an exemplary production process 218 that incorporates stiffness test process 134 (FIG. 8). Production process 204 is described in connection with the production of two generally identical MEMS device wafers for simplicity of illustration. Those skilled in the art will recognize that production process 218 may be executed for a plurality of MEMS device wafers in a manufacturing facility.

Production process 218 entails fabrication (220) of at least two generally identical MEMS device wafers. In this example, the MEMS device wafers may be MEMS pressure sensor device wafers having a plurality of pressure sensors formed thereon. The MEMS pressure sensor device wafers are referred to herein as a test device wafer and a production device wafer. While still at wafer-level, stiffness test process 134 (FIG. 8) is performed (220) on the test device wafer to produce substrate map 166 (FIG. 9). The production device wafer is diced, cut, sawn or otherwise separated to singulate (224) the pressure sensor dies on the production device wafer. The singulated pressure sensor dies from the production device wafer are categorized (226), or binned, according to the stiffness results determined from substrate map 166.

The singulated and categorized pressure sensor dies from the production device wafer can be selected, finished, and packaged (228), according to their bin designation. That is, the pressure sensor dies can be selected based upon their rated performance. Thereafter, production process 218 ends. Of course, those skilled in the art will recognize that production process 218 can have additional operations, not shown herein for simplicity of illustration. Furthermore, the second MEMS pressure sensor wafer can be subjected to strength test process 90 (FIG. 5) and/or calibration factor determination process 176 (FIG. 10) at wafer-level to identify failed pressure sensors and/or to determine individual calibration factors 192 for each of the pressure sensor dies.

Figure 13:
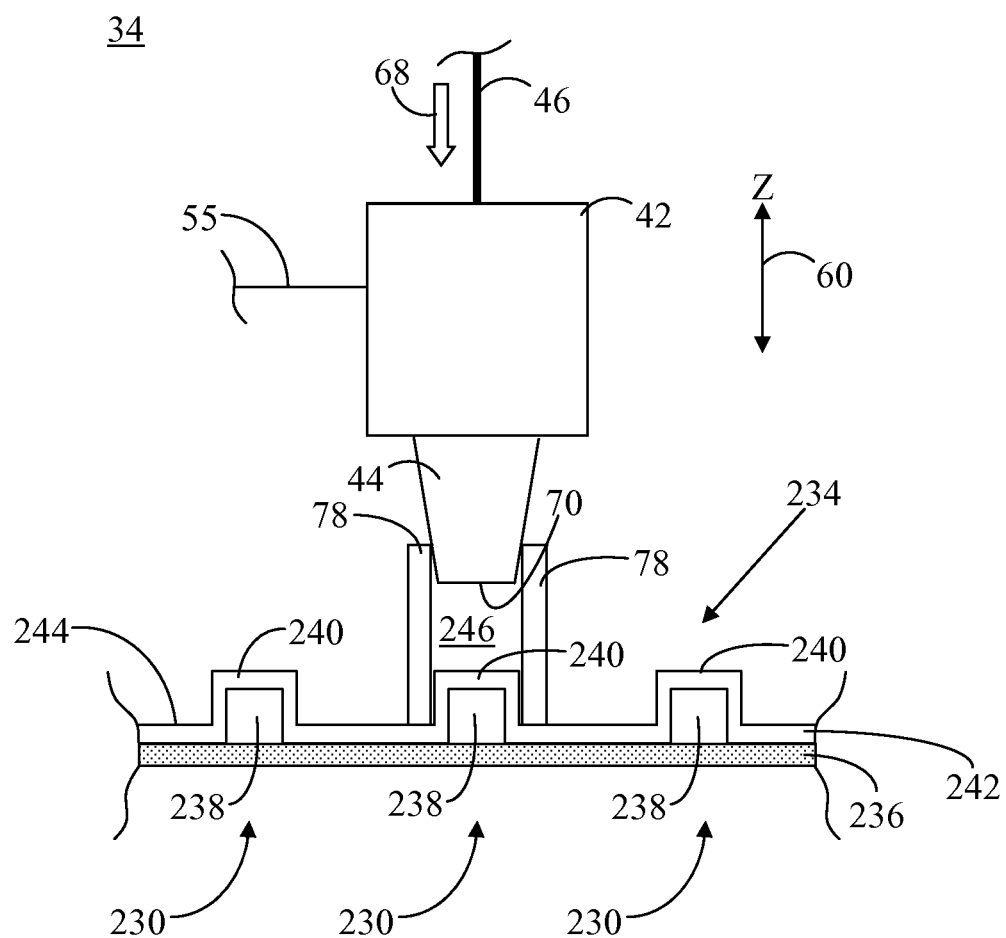
FIG. 13 shows an enlarged partial view of the test system with a nozzle utilized to apply a pneumatic pressure stimulus to an absolute pressure sensor in accordance with an alternative embodiment.

FIG. 13 shows an enlarged partial view of test system 34 with nozzle 44 utilized to apply pneumatic pressure stimulus 68 to an absolute pressure sensor 230 in accordance with an alternative embodiment. The description provided above shows a differential pressure sensor in which pneumatic pressure stimulus 68 is applied from the back side, i.e., from the substrate facing side, into pressure chamber 28 via port 32. In an alternative embodiment, pneumatic pressure stimulus 68 may be applied on the front side, i.e., the diaphragm facing side. Such a configuration may be useful when performing wafer-level testing on a MEMS device wafer 234 having, for example, a plurality of absolute pressure sensors 230 formed thereon.

In the exemplary configuration, absolute pressure sensors 230 are formed on a substrate 236 in accordance with known methodologies. Each of pressure sensors 230 has a sealed pressure cavity 238 and a diaphragm 240 formed in a structural layer 242 on substrate 236. Diaphragm 240 serves as one of the walls of sealed pressure cavity 230. Per convention, sealed pressure cavity 238 may be fabricated and sealed under vacuum. Following wafer level testing, later fabrication processes may involve forming or otherwise attaching a cap layer (not shown) over structural layer 242.

In an embodiment, nozzle 44 is directed by signals received via signal line 55 to move along Z-axis 60 toward the front side of MEMS device wafer 234. That is, nozzle 44 moves toward structural layer 242 containing pressure sensors 232. In the illustrated example, seal element 78 surrounding outlet 70 of nozzle 44 is placed in contact with an exterior surface 244 of structural layer 242 surrounding one of pressure sensors 232. As nozzle 44 is driven toward exterior surface 244, mechanical force is applied to seal element 78 to form a pressure seal between exterior surface 244 of structural layer 242 and seal element 78. Accordingly, a sealed cavity 246 associated with one of pressure sensors 232 is at least temporarily formed for the purpose of wafer-level testing, and diaphragm 240 is located within this sealed cavity 246.

Like the configuration shown in FIG. 4, pneumatic pressure stimulus 68 can be applied to diaphragm 240 via nozzle 44 extending into sealed cavity 246. In general, the pressure within sealed cavity 246 changes in response to pneumatic pressure stimulus 68, and this pressure, i.e., pressure signal 72 (FIG. 3), can be detected by inline pressure sensor 50 (FIG. 3) and can be used to test the strength and/or stiffness of diaphragm 240. Thus, pressure sensor strength test process 90 (FIG. 5), pressure sensor stiffness test process 134 (FIG. 8), and/or pressure sensor calibration process 176 (FIG. 10) may be adapted to test the strength and/or stiffness of diaphragm 240, and to determine one or more calibration factors for the particular pressure sensor 232 under test.

It is to be understood that certain ones of the process blocks depicted in FIGS. 5, 8, and 10-12 may be performed in parallel with each other or with performing other processes. In addition, it is to be understood that the particular ordering of the process blocks depicted in FIGS. 5, 8, and 10-12 may be modified, while achieving substantially the same result. Accordingly, such modifications are intended to be included within the scope of the inventive subject matter. In addition, although particular system configurations are described in conjunction with FIGS. 3, 4, and 13, above, embodiments may be implemented in systems having other architectures, as well. These and other variations are intended to be included within the scope of the inventive subject matter.

Thus, various embodiments of a test system and a method of testing a plurality of MEMS devices at wafer-level have been described. An embodiment of a method for testing a plurality of pressure sensors on a device wafer comprises placing a diaphragm of one of the pressure sensors on the device wafer in proximity to a nozzle of a test system, applying a pneumatic pressure stimulus to the diaphragm via an outlet of the nozzle, and measuring a cavity pressure within a cavity associated with the one of the pressure sensors in response to the applying the pneumatic pressure stimulus.

An embodiment of a test system for testing pressure sensors on a device wafer, in which each of the pressure sensors includes a diaphragm, and the test system comprising a table for retaining the device wafer, a nozzle, and an actuator for placing the nozzle and the diaphragm of one of the pressure sensors in proximity to one another. A fluid supply line is in communication with the nozzle for providing a pneumatic pressure stimulus, the pneumatic pressure stimulus being applied to the diaphragm via an outlet of the nozzle. A pressure transducer for measures a pressure within the fluid supply line in response to the pneumatic pressure stimulus, the pressure being indicative of a cavity pressure within a cavity associated with the one of the pressure sensors, and a controller is configured to receive the pressure and ascertain functionality of the one of the pressure sensors in response to the pressure.

Such wafer-level testing provides the capability of determining critical mechanical and electrical characteristics of the MEMS devices, for example, MEMS pressure sensor devices. Embodiments provide the capability for verifying the strength and stiffness of each individual MEMS pressure sensor at wafer-level under a gauged pneumatic pressure stimulus. Embodiments further enable electrical die measurement at a gauged pressure stimulus, which can be used for functional die testing, and/or for calibration and compensation of the MEMS pressure sensor devices. Functional testing of MEMS pressure sensor devices at wafer-level can decrease the cost of the final product by rejecting bad MEMS pressure sensor devices before any assembly steps and/or for providing quick feedback to a product line.

While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently so that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A method for testing a plurality of pressure sensors on a device wafer, wherein said pressure sensors are located on a first side of a substrate portion of said device wafer, each of said pressure sensors includes a cavity, a port extends through said substrate portion from a second side of said substrate portion to said first side into said cavity, and said method comprises:
- placing a diaphragm of one of said pressure sensors on said device wafer in proximity to a nozzle of a test system;
- positioning a seal element surrounding an outlet of said nozzle in contact with said second side of said substrate portion surrounding said port;
- applying mechanical force to said seal element to form a pressure seal between said second side of said substrate portion and said seal element;
- applying a pneumatic pressure stimulus to said diaphragm via said outlet of said nozzle, wherein said pneumatic pressure stimulus is imposed on said diaphragm via said port and said cavity associated with said one of said pressure sensors; and
- measuring a cavity pressure within said cavity in response to said applying said pneumatic pressure stimulus.

2. The method of claim 1 wherein said placing comprises:
- retaining said device wafer in said test system such that said device wafer is substantially parallel to an X-Y plane of said test system; and
- moving at least one of said nozzle and said device wafer along a Z-axis substantially perpendicular to said X-Y plane to place said diaphragm of one of said pressure sensors in proximity to said nozzle.

3. The method of claim 1 further comprising:
- retaining said device wafer in a wafer chuck of said test system such that said device wafer is substantially parallel to an X-Y plane of said test system, wherein said wafer chuck is coupled to a movable X-Y stage of said test system;
- indexing said X-Y stage to place successive diaphragms of successive ones of said plurality of pressure sensors in proximity to said nozzle; and
- performing said applying said pneumatic pressure stimulus operation and said measuring operation for each of said successive ones of said plurality of pressure sensors.

4. The method of claim 1 further comprising performing said measuring operation while said port into said cavity remains sealed.

5. The method of claim 1 wherein each of said plurality of pressure sensors has a maximum pressure rating, and said applying operation applies said pneumatic pressure stimulus having a magnitude that is at least equivalent to said maximum pressure rating.

6. The method of claim 1 wherein following said measuring operation, said method further comprises identifying said pressure sensor as a defective sensor when said cavity pressure is outside of a passing range defined by at least one of a low pressure threshold and a high pressure threshold.

7. The method of claim 6 further comprising:
- performing said placing, applying said pneumatic pressure stimulus, and measuring operations for each of said plurality of pressure sensors on said device wafer;
- identifying a first subset of said pressure sensors on said device wafer as being defective sensors when said cavity pressure for each of said pressure sensors in said first subset is outside of said passing range;
- identifying a second subset of said pressure sensors on said device wafer as being functional sensors when said cavity pressure of each of said pressure sensors in said second subset is within said passing range;
- dicing said device wafer to produce a plurality of singulated pressure sensors; and
- discarding said first subset of said pressure sensors following said dicing.

8. The method of claim 1 further comprising:
- performing said placing, applying said pneumatic pressure stimulus, and measuring operations for each of said plurality of pressure sensors on said device wafer, wherein:
  - for said each of said plurality of pressure sensors, said applying said pneumatic pressure stimulus comprises applying successively greater magnitudes of said pneumatic pressure stimulus; and
  - for said each of said plurality of pressure sensors, said measuring comprises identifying a failure pressure, said failure pressure being one of said successively greater magnitudes of said pneumatic pressure stimulus at which said cavity pressure is outside of a passing range defined by at least one of a low pressure threshold and a high pressure threshold.

9. The method of claim 8 wherein said device wafer is a first device wafer, and said method further comprises:
- producing a substrate map of said first device wafer, said substrate map correlating those of said pressure sensors at locations on said first device wafer as having a same one of said failure pressure; and
- categorizing a second plurality of pressure sensors on a second device wafer according to said failure pressure provided in said substrate map for said first device wafer.

10. The method of claim 1 further comprising:
- measuring at least one output pressure signal from said pressure sensor in response to said pneumatic pressure stimulus; and
- determining a calibration factor for said pressure sensor in response to said at least one output pressure signal.

11. A method for testing a plurality of pressure sensors located on a first side of a substrate portion of a device wafer, each of said pressure sensors including a diaphragm and a cavity, said diaphragm being formed in at least one wall surrounding said cavity, a port extends through said substrate portion from a second side of said substrate portion to said first side into said cavity, and said method comprises:
- retaining said device wafer in a wafer chuck of a test system such that said device wafer is substantially parallel to an X-Y plane of said test system, wherein said device wafer chuck is coupled to a movable X-Y stage;
- indexing said X-Y stage to place one of said plurality of pressure sensors in proximity to a nozzle of said test system;
- moving at least one of said nozzle and said device wafer along a Z-axis substantially perpendicular to said X-Y plane to position said diaphragm of said one of said pressure sensors in proximity to said nozzle;
- sealing said cavity associated with said one of said pressure sensors, said sealing including positioning a seal element surrounding an outlet of said nozzle in contact with a second side of said substrate portion surrounding said port and applying mechanical force to said seal element to form a pressure seal between said second side of said substrate portion and said seal element to thereby seal said cavity;
- applying a pneumatic pressure stimulus from an outlet of said nozzle to said diaphragm via said cavity, said applying occurring following said sealing, wherein said pneumatic pressure stimulus is imposed on said diaphragm via said port and said cavity associated with said one of said pressure sensors; and measuring a cavity pressure within said cavity in response to said applying said pneumatic pressure stimulus, said measuring occurring while a port into said cavity remains sealed.

12. The method of claim 11 further comprising:
performing said indexing, moving, sealing, applying, and measuring operations for each of said plurality of pressure sensors on said device wafer;
identifying a first subset of said pressure sensors on said device wafer as being defective sensors when said cavity pressure for each of said pressure sensors in said first subset is outside of a passing range defined by at least one of a low pressure threshold and a high pressure threshold;
identifying a second subset of said pressure sensors on said device wafer as being functional sensors when said cavity pressure of each of said pressure sensors in said second subset is within said passing range;
dicing said device wafer to produce a plurality of singulated pressure sensors; and
discarding said first subset of said pressure sensors following said dicing.

13. The method of claim 11 further comprising:
performing said indexing, moving, sealing, applying, and measuring operations for each of said plurality of pressure sensors on said device wafer, wherein:
for said each of said plurality of pressure sensors, said applying comprises applying successively greater magnitudes of said pneumatic pressure stimulus; and
for said each of said plurality of pressure sensors, said measuring comprises identifying a failure pressure, said failure pressure being one of said successively greater magnitudes of said pneumatic pressure stimulus at which said cavity pressure is outside of a passing range defined by at least one of a low pressure threshold and a high pressure threshold; and
producing a substrate map of said device wafer, said substrate map correlating those of said pressure sensors at locations on said device wafer as having the same magnitude of said failure pressure.

14. The method of claim 11 further comprising:
performing said indexing, moving, sealing, applying, and measuring operations for each of said plurality of pressure sensors on said device wafer;
for said each of said pressure sensors, measuring at least one output pressure signal from said pressure sensor in response to said pneumatic pressure stimulus; and
for said each of said pressure sensors, determining a calibration factor for said pressure sensor in response to said at least one output pressure signal.

15. A test system for testing pressure sensors on a device wafer, wherein said pressure sensors are located at a first side of a substrate portion of said device wafer, each of said pressure sensors includes a diaphragm and a cavity, a port extends through said substrate portion from a second side of said substrate portion to said first side into said cavity, and said test system comprises:
a table for retaining said device wafer;
a nozzle;
an actuator for placing said nozzle and said diaphragm of one of said pressure sensors in proximity to one another;
a seal element surrounding an outlet of said nozzle, wherein said seal element is adapted for mechanical contact with said second side of said substrate portion surrounding said port to form a pressure seal between said second side of said substrate portion and said seal element;
a fluid supply line in communication with said nozzle for providing a pneumatic pressure stimulus, said pneumatic pressure stimulus being applied to said diaphragm associated with one of said pressure sensors via an outlet of said nozzle, wherein said pneumatic pressure stimulus is imposed on said diaphragm via said port and said cavity associated with said one of said pressure sensors;
a pressure transducer for measuring a pressure within said fluid supply line in response to said pneumatic pressure stimulus, said pressure being indicative of a cavity pressure within said cavity; and
a controller configured to receive said pressure and ascertain functionality of said one of said pressure sensors in response to said pressure.

16. The test system of claim 15 further comprising:
a movable X-Y stage;
a wafer chuck coupled to said movable X-Y stage, said wafer chuck being adapted to retain said device wafer, wherein said movable X-Y stage is indexed to place successive ones of said pressure sensors in proximity to said nozzle.

* * * * *